United States Patent [19]

Hakhverdian

[11] 4,446,423

[45] May 1, 1984

[54] LINEAR SELF-EXCITED CAPACITANCE BRIDGE

[76] Inventor: Armik A. Hakhverdian, 1153 Janis Way, San Jose, Calif. 95125

[21] Appl. No.: 432,095

[22] Filed: Sep. 29, 1982

[51] Int. Cl.³ .................... G01R 27/26; G01R 27/00
[52] U.S. Cl. .................... 324/60 C; 324/57 R; 324/60 R; 324/DIG. 1
[58] Field of Search .............. 331/65, 56, 117 R; 324/60 C, 60 R, DIG. 1, 61 QS, 57 R

[56] References Cited

U.S. PATENT DOCUMENTS 4,038,609  7/1977  Langberg .................... 331/65
4,295,091 10/1981  Ponkala ...................... 324/60 C X

FOREIGN PATENT DOCUMENTS 1201573  9/1965  Fed. Rep. of Germany ........ 331/65

Primary Examiner—Stanley T. Krawczewicz
Assistant Examiner—Jose M. Solis
Attorney, Agent, or Firm—Wenderoth, Lind & Ponack

[57] ABSTRACT

A versatile linear self-excited bridge primarily intended for the measurement or comparison of very low capacitance values. The differential input of the device makes it suitable in a variety of other applications such as, tachometers, gap or position indicators, null detectors, transducers, etc. The inputs of a pair matched bipolar transistors which exhibit negative resistance characteristics are connected to a common inductor which completes an oscillatory loop. The ratio of the DC potentials at the collectors of the two transistors are directly related in their respective emitter capacitors, and hence when, these capacitors are equal in value, the output of a differential amplifier having inputs which are connected to the collectors of the two transistors is zero.

4 Claims, 3 Drawing Figures

LINEAR SELF-EXCITED CAPACITANCE BRIDGE

BACKGROUND OF THE INVENTION

The present invention relates to a linear self-excited bridge for use in measuring or comparing capacitive elements which may have low capacitive values.

SUMMARY OF THE INVENTION

The object of the present invention is to provide a linear self-excited bridge for measuring or comparing capacitive elements which may have very low capacitance values. The inputs of a pair of matched bipolar transistors are connected to one terminal of a common inductor whose second terminal is grounded. The pair of capacitive elements to be compared have one of their respective terminals connected to the emitters of the pair of bipolar transistors and have their other terminals connected to ground. The ratio of the DC potentials at the collectors of the two bipolar transistors are directly related to the capacitance of the capacitive elements. Accordingly, when the two capacitive elements are equal in value, the output of a differential amplifier whose inputs are connected to the collectors of the two transistors is equal to zero.

DESCRIPTION OF THE PREFERRED EMBODIMENT

Figure 1:
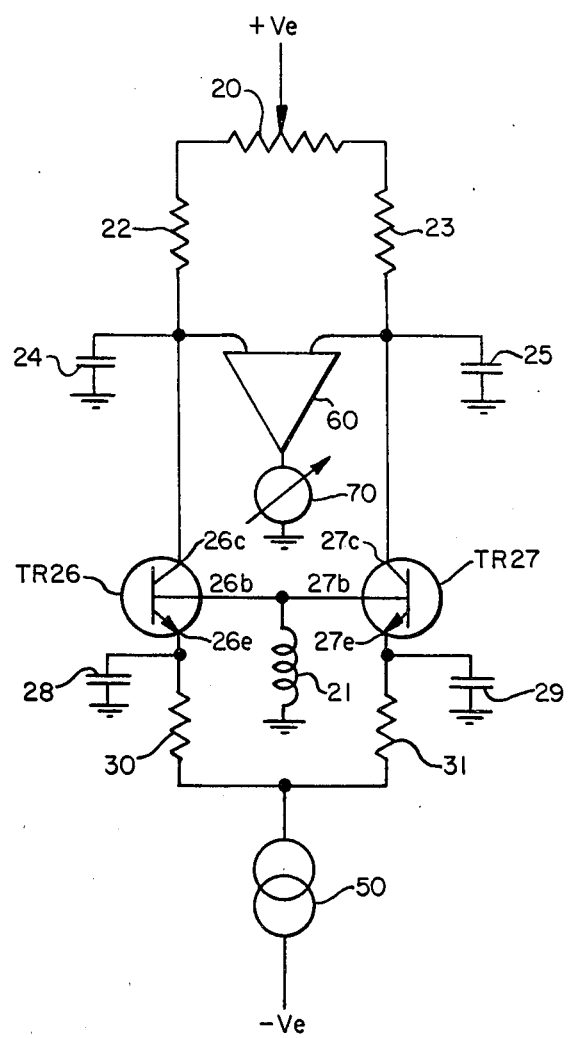
FIG. 1 illustrates a circuit diagram of an embodiment of the present invention.

FIG. 1 shows two matched bipolar transistors TR26 and TR27 comprising the bridge proper of the system. Collector 26c of transistor TR26 is decoupled to ground by means of capacitor 24 and is connected to the positive supply through load 22 and the left-hand arm of the balancing potentiometer 20. In a like manner, collector 27c of transistor TR27 is decoupled to ground by means of capacitor 25 and connected to the positive supply through load 23 and the right-hand arm of the balancing potentiometer 20. The base 26b of transistor TR26 is directly connected to the base 27b of the transistor TR27 and the said connection grounded through an inductor 21. The emitter 26e of transistor TR26 is connected to ground by means of capacitor 28 and in a like manner, the emitter 27e of transistor TR27 is connected to ground by means of capacitor 29. Emitters 26e and 27e are connected to a common constant current source 50 through their emitter biasing resistors 30 and 31.

As shown in the analysis below, provided that the transconductance of the transistors TR26 and TR27 exceed a minimum value, the system is unstable and oscillations ensue at a frequency which is substantially determined by the values of capacitors 28 and 29 and inductor 21.

The sum of the average collector currents of transistors TR26 and TR27 is a constant determined by the parameters of the constant current generator 50, and thus any rise of collector current in one branch should accompany an equal fall of current in the other. The ratio of potential differences developed across loads 22 and 23 is directly proportional to the ratio of their respective emitter capacitors 28 and 29.

Potentiometer 20 is incorporated to balance the bridge initially for differences in the resistor values or semiconductor parameters. To set up the bridge, oscillations are stopped by grounding inductor 21 by means of a large capacitor and the potentiometer 20 then adjusted for a zero reading of the indicator 70.

Indicator 70 is operated by the output current (or voltage) of the differential amplifier 60.

The complete analysis of FIG. 1 is extremely involved, instead a much more simplified version is offered below merely to explain in more detail the operation of the bridge and, at the same time, to derive in an approximate form expressions for deriving the frequency of operation, etc.

Figure 2:
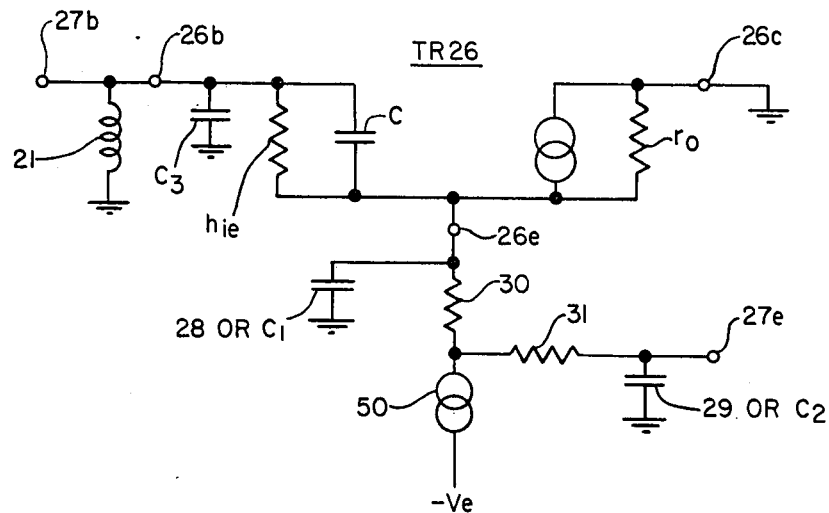
FIG. 2 is a circuit diagram of the AC equivalent model of the transistor TR26 together with a portion of its associated external components as illustrated in FIG. 1.

The AC equivalent of transistor TR26 together with its associated external components is given in FIG. 2; amplifier 60, indicator 70, and transistor TR27 together with its associated circuits are omitted. Capacitor C3 represents the Miller Effect capacitance bridging the input since the collector 26c is virtually at ground potential due to the decoupling of capacitor 24 as shown in FIG. 1.

To simplify matters to a great deal without impairing the important features of the analysis, the following assumptions are made:

a—At the frequency of operation, the input resistance, hie, of transistor TR26 is much larger than the reactance of its base-emitter junction capacitance C.

b—The output resistance, $r_o$, of transistor TR26 is sufficiently large so as to be neglected.

c—The reactance of emitter decoupling capacitor 28, relabled in FIG. 2 as C1, is much smaller than the impedance presented by the rest of the circuit at 26e.

d—The reactance of C3 is large enough to be disregarded.

e—The electrical characteristics of transistors TR26 and TR27 are identical.

Figure 3:
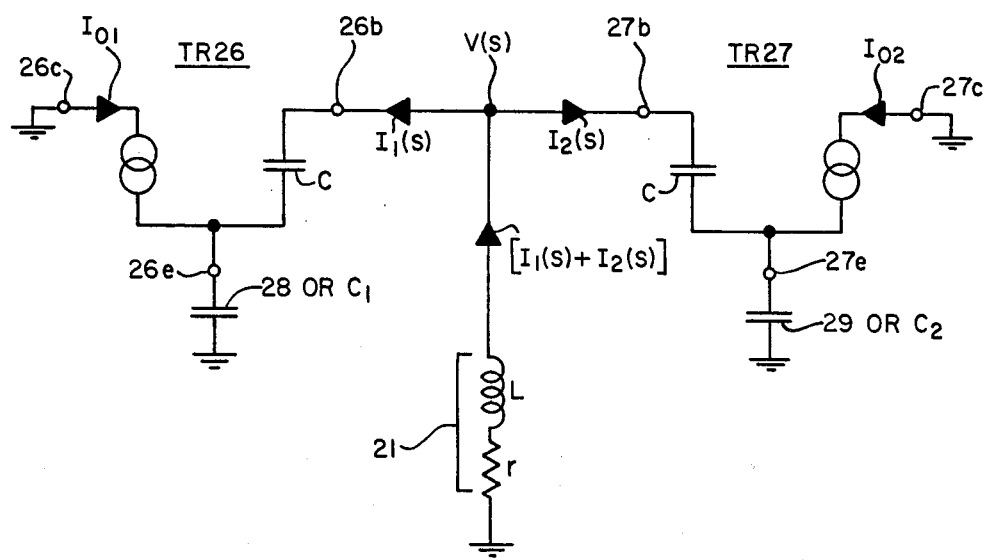
FIG. 3 is a redrawn version of FIG. 1 incorporating the features illustrated in FIG. 2 but omitting some elements for clarity.

With the above points in mind, FIG. 1 is redrawn as shown in FIG. 3 and incorporating the main features of FIG. 2 repeated for transistor TR27 as well. Here again amplifier 60, indicator 70 and current generator 50 are omitted and some of the components relabled for ease but retaining the numbering used in FIG. 1.

Referring to FIG. 3, let a voltage V(s) exist at the junction of inductor 21 and the respective bases, 26b and 27b, or transistors TR26 and TR27. The following pair of equations describing the input impedances of transistors TR26 and TR27 are easily derived.

$$\frac{V(S)}{I_1(S)} = Z_1(S) = \frac{1}{S}\left(\frac{1}{C} + \frac{1}{C_1}\right) + g_m/S^2 CC_1 \quad \text{1a}$$

$$\frac{V(S)}{I_2(S)} = Z_2(S) = \frac{1}{S}\left(\frac{1}{C} + \frac{1}{C_2}\right) + g_m/S^2 CC_2 \quad \text{1b}$$

Capacitors C1 and C2 are small compared to the base-emitter junction capacitances C. This can be achieved in practice by connecting capacitors externally between base and emitter should the operating frequency of the bridge be chosen sufficiently low to warrant such a measure. This being the case, the reactance of C is disregarded and thus equations 1a and 1b reduce to:

$$Z_1(S) \doteq \frac{1}{SC_1} + g_m/S^2CC_1 \qquad 2a$$

$$Z_2(S) \doteq \frac{1}{SC_2} + g_m/S^2CC_2 \qquad 2b$$

The summation of currents at the intersection of inductor 21 and bases 26b and 27b yields:

$$I_1(S)\left[\frac{1}{SC_1} + g_m/S^2CC_1\right]/(r + SL) = -[I_1(S) + I_2(S)] \qquad 3a$$

Considering the potential V(s) common to both transistor input circuits, one has:

$$I_1(S)\left[\frac{1}{SC_1} + \frac{g_m}{S^2CC_1}\right] = I_2(S)\left[\frac{1}{SC_2} + \frac{g_m}{S^2CC_2}\right] \qquad 3b$$

The simultaneous solution of 3a and 3b yields:

$$\frac{I_1(S)}{I_2(S)} = \frac{C_1}{C_2} \qquad 4a$$

and $$-\left[\frac{1}{SC_1} + \frac{g_m}{S^2CC_1}\right] = r\left(1 + \frac{C_2}{C_1}\right) + SL\left(1 + \frac{C_2}{C_1}\right) \qquad 4b$$

Converting equation 4b into the time domain and equating the real and imaginary parts to zero, one has:

$$\frac{1}{j\omega C_1} = -j\omega L\left(1 + \frac{C_2}{C_1}\right) \qquad 5a$$

whence $\omega^2 = \frac{1}{L(C_1 + C_2)}$ and $-\frac{g_m}{\omega^2 CC_1} = -r\left(1 + \frac{C_2}{C_1}\right)$ Substituting equation 5a in the above:

$$\frac{g_m L(C_1 + C_2)}{CC_1} = r\left(1 + \frac{C_2}{C_1}\right) \text{ whence } g_m = \frac{Cr}{L}$$

But strictly:

$$g_m \geq \frac{Cr}{L} \qquad 5b$$

Thus, provided that $g_m$ is greater than Cr/L, oscillations ensue at a frequency given approximately by the square root of the expression 5a. There is in fact an upper limit for $g_m$ beyond which oscillations stop, but this should not concern us here.

Returning to equation 4a and multiplying the numerator and denominator of the left-hand-side by $g_m/\omega^2 C^2$ one has:

$$\frac{I_1(S) \times g_m/\omega^2 C^2}{I_2(S) \times g_m/\omega^2 C^2} = \frac{I_{01}(S)}{I_{02}(S)} = \frac{C_1}{C_2} \qquad 6$$

The above equation shows that the ratio of output currents of transistors TR26 and TR27 is directly proportional to the ratio of their respective emitter decoupling capacitors C1 and C2. Obviously, when C1=C2, then the collector currents are equal and the output of the difference amplifier 60 is zero.

As stated earlier, the sum of the average emitter currents of transistors TR26 and TR27 and hence their respective collector currents is a constant determined by the parameters of the constant current source 50. This implies that whereas the total collector current can be reduced by the increase of the negative bias on bases 26b and 27b, the reverse is not true, i.e. the total collector current cannot be increased by decreasing the negative bias. Thus, TR26 and TR27 act to unidirectionally clip the positive excursion of a time varying or direct potential. The reverse of the foregoing is true for PNP semiconductors.

As shown, the ratio of the two collector currents is directly proportional to the ratio of their respective emitter capacitors, and hence, collector potentials developed across loads 22 and 23 (see FIG. 1) follow the same proportion.

Capacitors 24 and 25 (see FIG. 1) smooth out the AC ripple and thus, a differential DC potential is applied to the input of amplifier 60. The operating points of TR26 and TR27 and consequently the average potentials existing at the inputs of the differential amplifier are equal when capacitors 28 and 29 are equal.

I claim:
1. An apparatus for comparing first and second capacitive elements, said apparatus comprising:
   first and second semiconductor amplifying devices, each semiconductor device having an input terminal, a control terminal, and an output terminal;
   an inductive element having a first terminal which is grounded and having a second terminal connected to said control terminals of said first and second semiconductor devices;
   first and second reactive networks, respectively including said first and second capacitive elements and respectively connected to said input terminals of said first and second semiconductor devices;
   a constant current source which is operatively electrically connected to said first and second reactive networks;
   a resistive network having at least one adjustable resistance element, said resistive network operatively connected to said output terminals of said first and second semiconductor devices;
   a measurement means operatively connected to said output terminals of said first and second semiconductor devices for measuring the relative voltage therebetween;
   wherein the values of said resistance and reactive networks and inductive element and parameters of said semiconductor devices are selected such that said apparatus oscillates at a predetermined frequency;
   and wherein if said adjustable resistive element of said resistive network is first adjusted so as to cause said measuring means to determine that the voltage between said output terminals of said first and sec- ond semiconductor devices has a zero DC value when said inductive element is shorted out with respect to an alternating current, then said measuring means indicates a zero value of potential difference across said output terminals of said first and second semiconductor devices when said first and second capacitive elements are equal in their capacitive value.

2. An apparatus as in claim 1, wherein the value of capacitance of a capacitive element of unknown value may be determined by using said capacitive element of unknown value as one of said first and second capacitive elements and sequentially substituting capacitive elements of known values for the other of said first and second capacitive elements until said measuring means indicates a zero potential difference across said output terminals of said first and second semiconductor devices, whereby the value of capacitance of said capacitive element of unknown value is equal to that of said capacitive element of known value.

3. An apparatus as in claim 1, wherein said first and second semiconductor devices each comprise a bipolar transistor.

4. An apparatus as in claim 2, wherein said first and second semiconductor devices each comprise a bipolar transistor.

* * * * *